United States Patent
Bhattacharjee et al.

(10) Patent No.: US 7,170,349 B2
(45) Date of Patent: Jan. 30, 2007

(54) LOW VOLTAGE BROADBAND GAIN CELL

(75) Inventors: Jishnu Bhattacharjee, San Jose, CA (US); Debanjan Mukherjee, San Jose, CA (US)

(73) Assignee: Scintera Networks, Inc., San Jose, CA (US)

( * ) Notice: Subject to any disclaimer, the term of this patent is extended or adjusted under 35 U.S.C. 154(b) by 133 days.

(21) Appl. No.: 10/946,738

(22) Filed: Sep. 21, 2004

(65) Prior Publication Data

US 2006/0061415 A1    Mar. 23, 2006

(51) Int. Cl.
    *H03F 3/45* (2006.01)
(52) U.S. Cl. .................. 330/254; 330/311; 330/258
(58) Field of Classification Search ............... 330/254, 330/311, 258
    See application file for complete search history.

(56) References Cited

U.S. PATENT DOCUMENTS

| | | | |
|---|---|---|---|
| 6,023,192 A * | 2/2000 | Didier | 330/254 |
| 6,236,268 B1 * | 5/2001 | Ridgers | 330/252 |
| 6,504,432 B1 | 1/2003 | Rokhsaz | |
| 6,529,075 B2 * | 3/2003 | Bruck et al. | 330/252 |
| 6,545,502 B1 | 4/2003 | Dasgupta et al. | |
| 6,639,468 B2 * | 10/2003 | Belot | 330/252 |
| 6,717,467 B2 | 4/2004 | Renous et al. | |
| 6,809,591 B1 * | 10/2004 | Ohashi | 330/279 |
| 2006/0091954 A1 * | 5/2006 | Darabi | 330/259 |

* cited by examiner

*Primary Examiner*—Patricia Nguyen
(74) *Attorney, Agent, or Firm*—Alan H. MacPherson; MacPherson Kwok Chen & Heid LLP; Gideon Gimlan

(57) ABSTRACT

T-coil structures are used in one embodiment to inject programmably-variable amounts of transistor biasing currents into the respective drains of current sinking transistor means of a broadband differential amplifier such that, when the differential amplifier is in common mode, total transistor drain current will exceed total voltage-dropping current passing through corresponding voltage-dropping resistances of the amplifier's transistor means. The T-coil structures keep the parasitic capacitances of the programmable current sources that provide the bias currents de-lumped from capacitances of the amplifier's output nodes and/or capacitances of the amplifier's voltage-dropping resistances (variable resistances) to thereby maintain a wide bandwidth.

39 Claims, 4 Drawing Sheets

Fig. 1A

NEXT AMP STAGE

LOW VOLTAGE BROADBAND GAIN CELL

FIELD OF DISCLOSURE

The invention relates generally to broadband differential amplifiers and more specifically to applications in which such amplifiers are cascaded so that the DC output state of one becomes the DC input state of the next.

CROSS REFERENCE TO CO-OWNED APPLICATIONS

The following copending U.S. patent applications are owned by the owner of the present application, and their disclosures are incorporated herein by reference:

(A) Ser. No. 10/724,443 filed: Nov. 26, 2003 by Mukherjee et al and originally entitled "ANALOG DELAY ELEMENTS";

(B) Ser. No. 10/724,449 filed: Nov. 26, 2003 by Bhattacharjee et al and originally entitled "Digitally Controlled Transconductance Cell"; and (C) Ser. No. 10/698,317 filed: Oct. 30, 2003 by Mukherjee et al and originally entitled "Programmable Passive Inductor".

DESCRIPTION OF RELATED ART

High speed communication links such as optical fiber links or electrically conductive links (e.g., copper links) typically operate at very high serial data rates, 1 Gb/s (one Giga bits per second) to 10 Gb/s for example. When analog processing is desired for the signals transmitted along these high speed links, such processing may call for analog circuitry having extremely wide bandwidths (including DC response) and for programmable adaptability which allows the circuitry to adapt automatically to changing environmental conditions. More specifically, if an optical-to-electrical-to-optical repeater is to be constructed that provides high fidelity processing of signals originated as a series of essentially rectangular pulses and passed through a fast link (e.g., a fiber link with a 10 Gb/s rate), it may be desirable to have an operative analog bandwidth on the order of several GHz, with real-time adaptive behavior. The wide bandwidth is needed because the frequency domain content of the rectangular input pulses often extends to frequencies many times larger than the maximum bit rate of the transmission itself. Adaptability is needed because link behavior can change in real-time as a function of temperature and other environmental parameters. Special analog design strategies may be needed for processing electrical signals of this type while simultaneously providing for a wide range of adaptability It is known in the art to use differential amplifiers for wide bandwidth applications. Differential amplifiers exhibit good common mode rejection, thereby providing a type of noise removal that is not as easy to achieve with other types of amplifiers.

The classical differential amplifier has two identical transistors feeding their source currents into a common current source, with each transistor having a drain load identical to the drain load of the other. One of the identical transistors (MOSFETS) receives a positive-polarity input voltage ($+V_{in}$) at its gate while its counterpoised twin receives an oppositely-going, counterpart of that input voltage ($-V_{in}$). When $+V_{in}$ equals $-V_{in}$ the circuit is in a symmetrically balanced state known as common mode ($V_{diff\_in\_cm}=+V_{in}-\{-V_{in}\}=0$). Ideally, when the amplifier is in common mode, each transistor will be conducting exactly half of the total current fed into the common current source ($I_{ds\_common}=I_c/2$). Identical voltages will then develop across the identical drain loads of the twin transistors ($V_{R\_common}=I_c \cdot R/2$). The differential output voltage will be essentially zero just the differential input voltage is essentially zero.

When $+V_{in}$ is perturbed slightly away from its common mode value, say in the positive direction (so that it can be expressed as $+V_{in}=V_{gcm}+V_{pert}$), and $-V_{in}$ is varied by the same magnitude in the opposite, negative direction (so that it can be expressed as $-V_{in}=V_{gcm}-V_{pert}$), the currents in the respective drain loads should also shift essentially linearly and in opposite directions so as to maintain a constant sum relation, $I_{d1}+I_{d2}=I_c$ at the common current source. Output voltages across the identical drain loads will shift according to the shifts of their corresponding drain currents. It is desirable to provide a linear transfer function between input voltage and output drain currents and output load voltages, usually with a voltage gain greater than unity. The amount of deviation ($V_{pert}$) that the differential amplifier can linearly handle when perturbed away from its symmetrically balanced, common mode state, often depends on the specific, $I_{ds}$-versus-$V_{ds}$ state that each of its twin transistors when the amplifier is in the common mode.

Differential amplifiers face a problem known as $V_{ds}$-choking. This happens when the IR voltage drop across each of the drain loads of the amplifier's twin transistors is too large in common mode. Each of the twin transistors is then pushed into a state where it is on the verge of entering its non-amplifying resistive mode of operation (also known as the triode region). This non-amplifying resistive mode is generally characterized by $V_{ds}$ being about equal to or is less than the difference, $V_{gs}-V_{th}$, where $V_{ds}$ is the drain-to-source voltage drop of the corresponding transistor, $V_{gs}$ is the gate-to-source voltage drop, and $V_{th}$ is a threshold voltage of the transistor. Such positioning of the $V_{ds\_cm}$ common mode, drain voltage near the region of $V_{ds} \leq V_{gs}-V_{th}$, leaves little room for $V_{ds}$ to swing lower in response to large input signals. The amplifier is not able to provide large linear gain in this situation. It is choked due to the value of $V_{ds\_cm}$ being to close to $V_{gs}-V_{th}$.

Another problem faced by differential amplifiers is known as $V_{gs}$-choking. This generally occurs when a number of differential amplifiers are cascaded together in series with direct DC connections from one amplifier to the next. Such practice is common in integrated circuits where it is impractical to insert large isolation capacitors between stages. If the common mode $V_{ds\_cm}$ voltage of a first stage is made relatively low, the lowered first stage voltage inherently reduces the $V_g$ voltage present at the gate of the next successive stage. If $V_g$ is too low when in the second stage is in common mode, the range of linear current swing for that second stage is choked. Linear operating range is typically a function of the $V_{gscm}-V_{th}$ difference. A low $V_{ds\_cm}$ in one stage reduces the $V_{gscm}-V_{th}$ difference of the next stage and thereby also reduces the linear swing range of that next stage. It is difficult to obtain high gain and wide linear range under such conditions. (Amplifier gain is proportional to its transconductance, $g_m$, where the latter is roughly proportional to the square root of, $I_{ds}$ times the transistor aspect ratio, W/L.)

The $V_{ds}$-choking and $V_{gs}$-choking problems are compounded when each of a cascaded series of differential amplifiers is made programmably tunable so that each amplifier operates in a slightly different mode. The programmable-tuning may providing adjustable gain in each such amplifier with different response peaks occurring in different frequency ranges for each. It is desirable to overcome the $V_{ds}$-choking and/or $V_{gs}$-choking problems of a cascaded series of differential amplifiers while still allowing for individual tuneability and wide bandwidth.

SUMMARY

A common mode biasing structure in accordance with the invention includes twin current injection sources for injecting bias current, with each respectively situated to inject its bias current in parallel with the voltage-dropping current flowing through a corresponding one of the two drain resistances of each of a cascaded plurality of differential amplifiers, where respective first inductors are interposed between the current injection nodes used by the twin current injection sources and the corresponding amplifier output nodes (i.e. drain nodes). The interposed, first inductors help to keep the inherent (parasitic) capacitances of the twin current injection sources from being additively lumped with the capacitances of the corresponding amplifier output nodes. This helps to preserve a wide bandwidth for the amplifier. In one embodiment, the drain-paralleling current injection sources are programmably adjustable so that the common mode output voltage of each stage can be individually adjusted as needed. A programmable memory may be used to determine when the current injection sources are turned on, and if so, to what extent.

The common mode biasing structure of the invention may further include a set of second inductors interposed between the current injection nodes and the primary drain resistances of the amplifier so as to further reduce capacitive lumping effects in the drain impedance circuits. This is particularly useful when the primary drain resistances are programmably-adjustable and the resistance adjustment means introduces its own parasitic capacitances. The inductive separation of the current injection nodes from the amplifier output taps and/or from the primary drain resistances allows for a corresponding de-lumping of parasitic capacitances that would otherwise work to reduce the bandwidth of the amplifier. The structure allows for programmable adjustment of the primary drain resistances, programmable adjustment of amplifier gain and a relatively wide frequency response range.

T-coil structures are used in one embodiment to inject programmably-variable amounts of transistor biasing currents into the respective drains of current sinking transistor means of a broadband differential amplifier such that, when the differential amplifier is in common mode, total transistor drain current will exceed total voltage-dropping current passing through corresponding voltage-dropping resistances of the amplifier's transistor means. The T-coil structures keep the parasitic capacitances of the programmable current sources that provide the bias currents, de-lumped from capacitances of the amplifier's output nodes and/or de-lumped from capacitances of the amplifier's voltage-dropping resistances (variable resistances) to thereby maintain a wide bandwidth. The T-coil structures simultaneously provide a high frequency boost to the response curve of the amplifier at relatively high frequencies where the output would otherwise drop-off due to high frequency shunting of output current to ground by parasitic capacitances of the amplifier's output nodes. In one embodiment, the coils of the T-structure are mutually coupled to thereby increase their effective inductances.

A cascaded series of differential amplifiers in accordance with the invention comprises two or more programmably-variable differential amplifiers where each of the programmably-variable differential amplifiers includes means for programmably-setting the gain of the corresponding amplifier and twin current injection sources respectively provided each to inject a drain-current increasing current in parallel with the currents flowing through the drain resistances of each corresponding differential amplifier. Respective inductors are interposed between the current injection nodes used by the twin current injection sources and the corresponding amplifier output nodes (i.e. drain nodes) so that the capacitances of the twin current injection sources are not additively lumped with the capacitances of the corresponding amplifier output nodes.

A differential amplifier in accordance with the invention comprises: (a) first and second symmetrical transistors having respective first and second drain nodes through which sum-constant currents ($I_{d1}+I_{d2}=I_c$) respectively flow; and (b) first and second, symmetrical drain impedances ($Z_{d1}$, $Z_{d2}$) respectively coupled to the first and second drain nodes, where each of the variable drain impedances has a current injection source respectively provided to inject additive drain current in excess of that conducted by the corresponding drain resistance, where an inductance is interposed between the current injection node used by the current injection source and the corresponding amplifier output node (i.e. drain node) so that the capacitance of the current injection source is not additively lumped into the capacitance of the corresponding amplifier output node.

Other aspects of the disclosure will become apparent from the below detailed description.

BRIEF DESCRIPTION OF THE DRAWINGS

The below detailed description section makes reference to the accompanying drawings, in which.

DETAILED DESCRIPTION

Figure 1A:
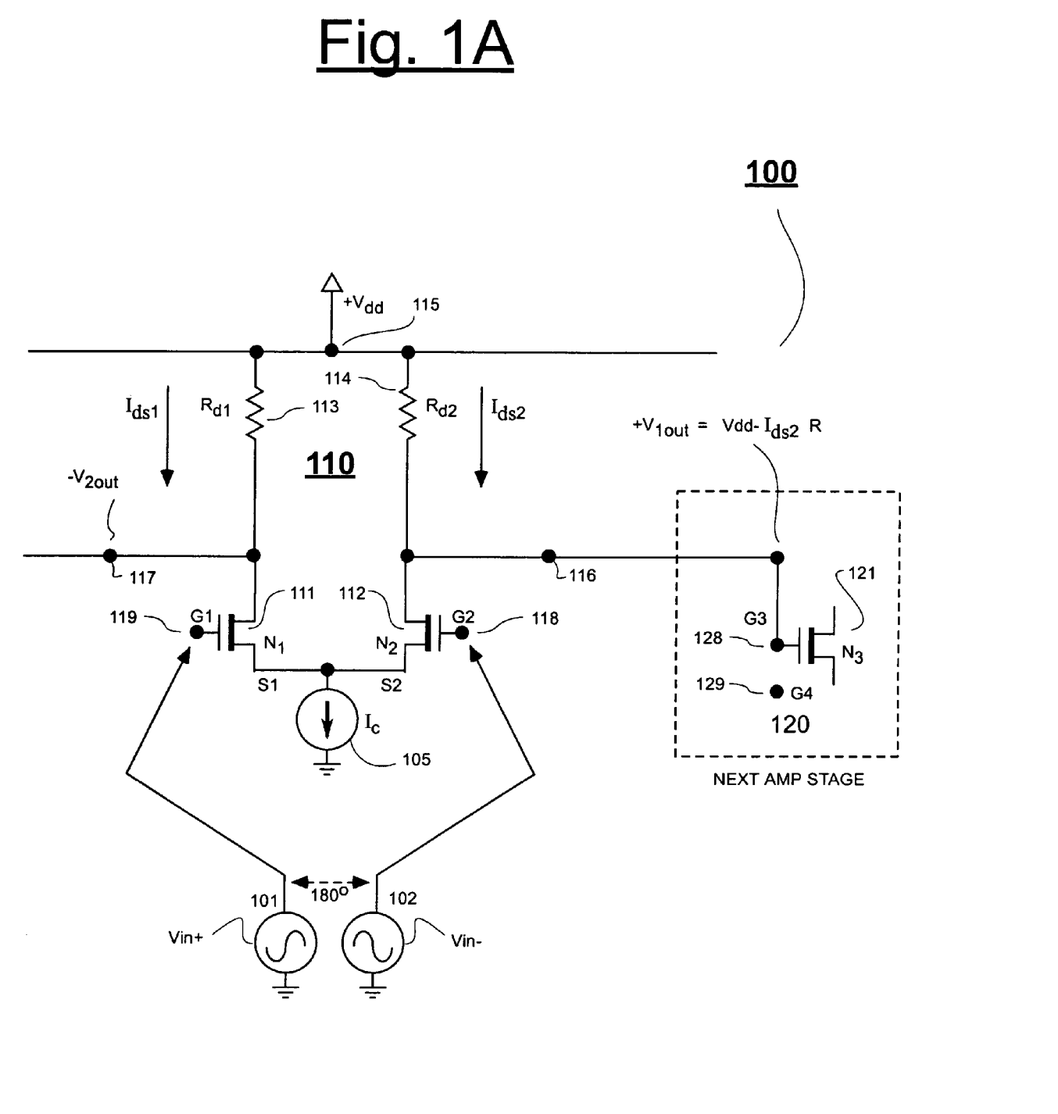
FIG. 1A is a schematic diagram showing a conventional, first differential amplifier being coupled directly (without DC isolation) to a next differential amplifier.

FIG. 1A shows a classical combination 100 of series cascaded, differential amplifiers such as amplifiers 110 and 120. The first differential amplifier 110 is defined by twin, N-channel transistors 111 and 112, and by a common current sink 105 coupled to their source nodes, $S_1$ and $S_2$. Drain load resistors 113 and 114 respectively couple to the drain nodes of transistors 111 ($N_1$) and 112 ($N_2$) and also to a power supply node 115 which provides a supply voltage, $+V_{dd}$. Part of the next differential amplifier 120 is shown with the gate node G3 of its transistor 121 ($N_3$) being directly connected to the drain output node 116 of transistor 112 ($N_2$). The drain output voltage, $+V_{1out}$, of transistor 112 ($N_2$) thus becomes the gate input voltage of next transistor 121 ($N_3$).

The magnitude of the first drain output voltage, $+V_{1out}$, may be defined as $V_{dd}-I_{ds2}\cdot R_{d2}$, where $I_{ds2}$ is the drain current of transistor 112 ($N_2$), and $R_{d2}$ is the drain load of the same transistor 112 ($N_2$). The magnitude of the complementary drain output voltage, $-V_{1out}$, at node 117 may be similarly defined as $V_{dd}-I_{ds1}\cdot R_{d1}$, where $I_{ds1}$ is the drain current of transistor 111 ($N_1$), and $R_{d1}$ is the corresponding drain load. It is understood that output node 117 couples directly to input node 129 (G4) of the next amplifier stage 120 in substantially the same manner as does output node 116 to input node 128 (G3) of the next amplifier stage.

The input voltage sources, 101 and 102, that couple to respective input nodes 119 (G1) and 118 (G2) of amplifier 110 should be complementary so that their respective voltage signals, $V_{in+}$ and $V_{in-}$ are 180 degrees apart. The differential input voltage, $V_{diff\_in}$, of amplifier 110 may be defined as: $+V_{in}-\{-V_{in}\}$. The common mode magnitude of that differential input voltage may be defined as: $V_{diff\_in\_cm}=+V_{in\_cm}-\{-V_{in\_cm}\}=0$, where $+V_{in\_cm}$ and $-V_{in\_cm}$ are respectively the common mode, input voltage levels at input nodes 119 (G1) and 118 (G2) when amplifier 110 is in its common mode. As already explained, when amplifier 110 is in common mode, each of its twin transistors, 111 and 112, should be conducting exactly half of the total current $I_C$ fed into the common current sink 105 ($I_{ds\_common}=I_c/2$). As a result, identical voltages should develop across the identical drain loads of the twin transistors ($V_{R\_common}=I_c\cdot R/2$). The differential output voltage between output nodes 116 and 117 will then be: $V_{diff\_out\_cm}=+V_{1out\_cm}-\{-V_{2out\_cm}\}=0$.

Figure 2:
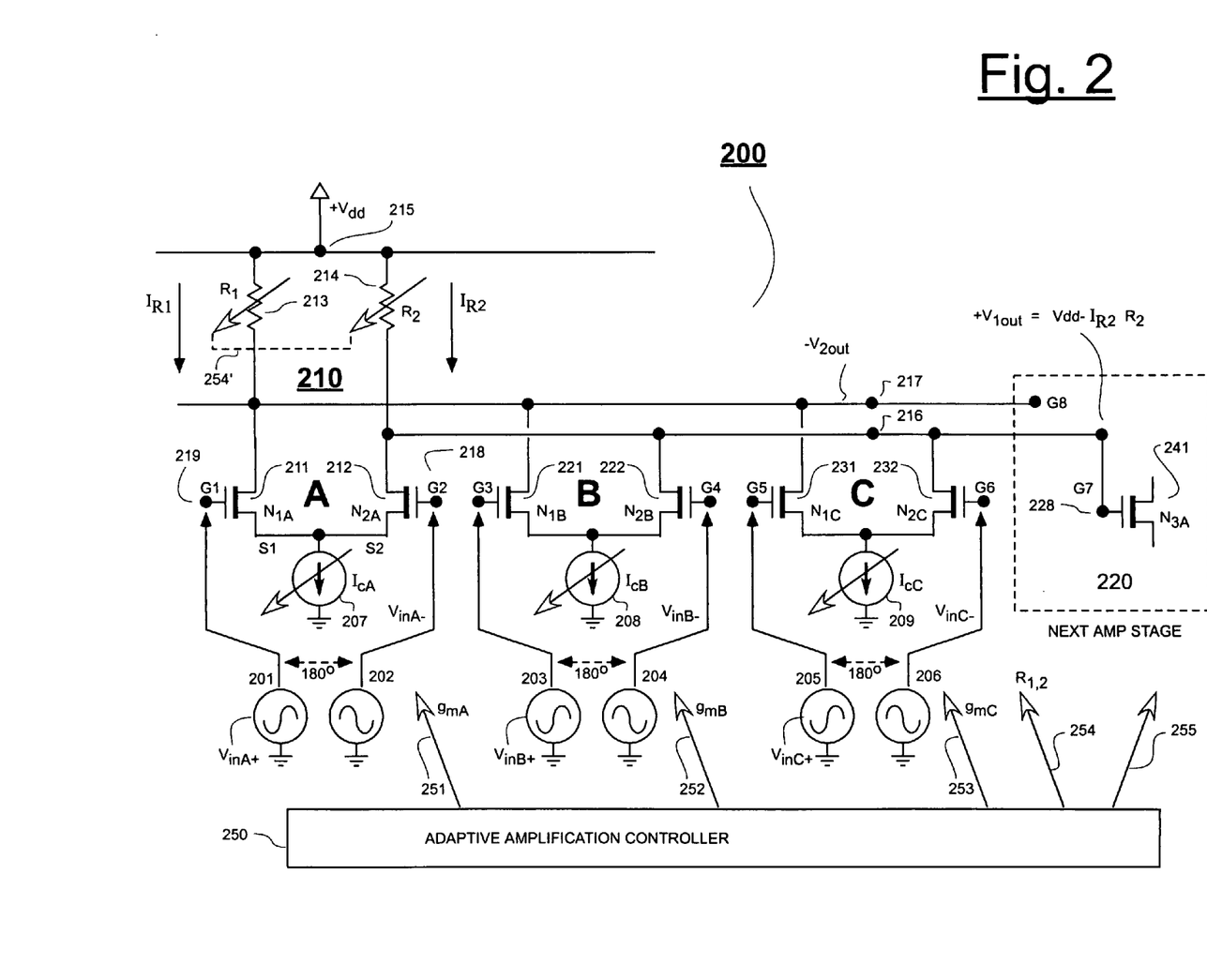
FIG. 2 is a schematic diagram showing a first multi-input, summing differential amplifier with variable gain capabilities (weighted summation), where the first amplifier is directly connected to the inputs of a next successive differential amplifier.

In some circumstances, the differential input voltage, $V_{diff\_in}$ may be a wide bandwidth communications signal such as that obtained from passing a series of substantially rectangular signal pulses through a transmission medium (e.g., a continuous fiber optic link) that exhibits signal dispersion. To correct for such dispersion, it may be desirable to use adaptively-weighted filtering where the weighting factors are determined by cascade-connected differential amplifiers. This will be better understood when FIG. 2 is detailed.

Figure 1B:
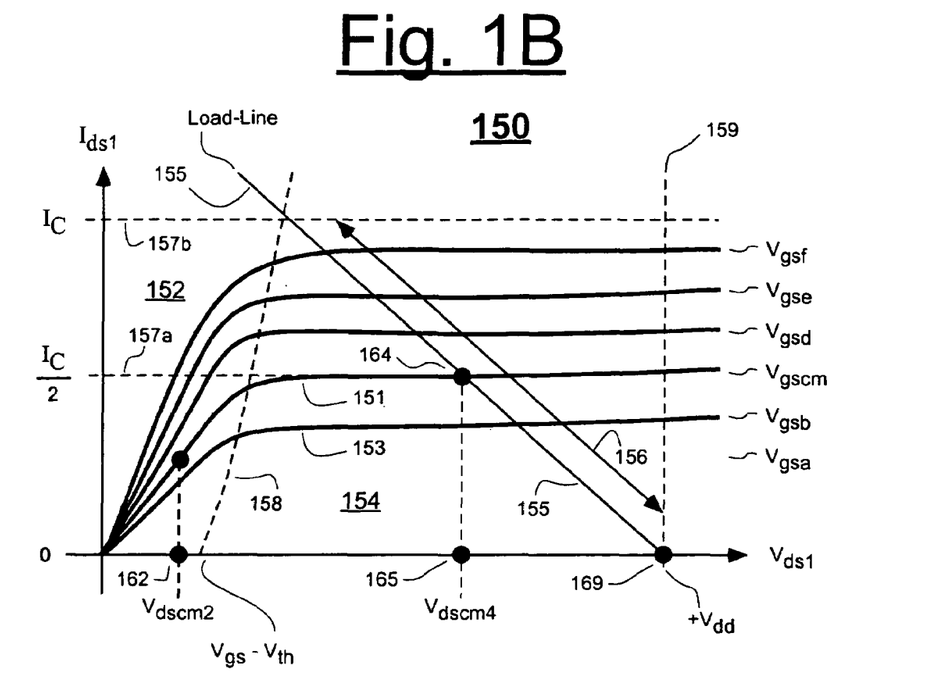
FIG. 1B is a plot of drain current ($I_{ds}$) versus drain-to-source voltage ($V_{ds}$) for explaining the behavior modes of one of the transistors shown in FIG. 1A.

Referring to FIG. 1B, the concept of $V_{ds}$-choking is explained in more detail. Each of transistors 111 and 112 has an essentially same characteristic set of graph plots for drain current ($I_{ds}$) versus drain-to-source voltage ($V_{ds}$), the saturating plots are for respective values of gate-to-source voltage ($V_{gs}$). Transistor 111 (N1) will be used as the example. Boundary conditions for the operation of transistor N1 are set by the load lines and power voltage of the differential amplifier circuitry shown in FIG. 1. In graph 150 (FIG. 1B), a first of the illustrated curves, 151 represents the independent behavior of N1 when its gate node 119 (G1) is held at the common mode, gate input level, $V_{gscm}$. Curve 153 represents the independent behavior of N1 when its gate (G1) is held at a slightly lower gate input level, $V_{gsb}$. Similar curves are shown for other gate input levels such as $V_{gsd}$ through $V_{gsf}$. Curve $V_{gsa}$ is not shown but is understood to lie below curve 153.

Transistor N1 may be biased to operate in a linear-resistive region 152 of its $I_{ds}/V_{ds}$ curves, to the left of dashed-curve 158; or in a saturated-amplifying region 154 of its $I_{ds}/V_{ds}$ curves, to the right of dashed-curve 158, this depending on what value of drain loading resistance ($R_{d1}$) is being used at the time, and on what value of drain supply voltage, $+V_{dd}$ is present, as well as on what gate voltage is present. The latter gate voltage determines the relevant $V_{gs}$ curve, 151, 153, etc. The dividing curve 158 between regions 152 and 154 runs through the knees of the saturating curves 151, 153, etc. and represents the condition where $V_{ds}$ is equal to $V_{gs}-V_{th}$. Those skilled in the art will understand that it is desirable to keep the operating mode of transistor N1 to the right of dividing curve 158 so as to provide good linear, amplifying action in response to changes of $V_{gs}$. However, if $+V_{dd}$ is relatively small (less than 5V, or worse yet less than 1.8V) and the drain load ($R_{d1}$) is relatively large, there is a good possibility that the common mode $V_{ds}$ of transistor N1 will be dragged to the left, for example to position 162 ($V_{dscm2}$) thereby causing the transistor to be placed into its undesirable, non-amplifying region 152 of operation. Response in region 152 to changes of $V_{gs}$ tends to be highly nonlinear.

FIG. 1B shows that the more preferred value for $V_{ds}$, when in common mode, is at point 165, where the latter corresponds to an operating point 164 on $V_{gs}$ curve 151 roughly midway between lines 158 and 159. Operating point 164 is established by pivoting the amplifier's load-line, 155 about pivot point 169 ($I_{ds}=0$, $V_{ds}=+V_{dd}$) so that the inverse-slope of load-line 155 represents the resistance (dV/dI) of the corresponding drain load $R_{d1}$ (FIG. 1A) and so that the current value of point 164 also satisfies $I_{ds}=I_c/2$. Curve 151 is the fixed $V_{gs}$ plot ($V_{gs}=V_{gscm}$) that happens to run through the intersection of the $I_{ds}=I_c/2$ line 157a and the theoretically-movable load-line 155. (Line 155 moves if the $+V_{dd}$ changes and/or if $R_{d1}$ changes.)

The operational swing 156 of transistor N1 is then confined by boundary conditions to moving along load-line 155, with the range extending from the point, 169 where $I_{ds}=0$ and $V_{ds}=+V_{dd}$ to the point where $I_{ds}=I_c$ (where line 155 crosses with line 157b). The common mode state of the swing range 156 is at point 164, where line 155 crosses with line 157a. $V_{ds}$-choking can occurs if pivot point 169 is dragged to the left (closer to saturation cutoff curve 158) and/or if the load-line 155 is pivoted counterclockwise about point 169 (to form a smaller angle with the $I_{ds}=0$ axis). When either of these things happens, point 164 is dragged to left along line 157a, moving undesirably closer to, or even to the left of, the saturation cutoff curve 158.

$V_{ds}$-choking is a significant problem for programmable integrated circuits for at least two reasons. First, as transistor lengths shrink deeper into the submicron regime and interconnect lines become narrower, the effective $+V_{dd}$ becomes smaller and smaller, typically about 1.8V or less and sometimes 1.6V–1.2V or less. Second, programmably-activated changes to parameters of the differential amplifier may alter the picture significantly by changing the slope of load-line 155 and/or by changing the heights of $I_c$ lines 157a–157b and/or by changing the position of pivot point 169 along the $I_{ds}=0$ axis and/or by changing the effective aspect ratios (W/L) of the transistors defining the bucking twins (N1 and N2), where the latter are shown more simply as just transistors 111 and 112 in FIG. 1A. (See, briefly, FIG. 2).

Figure 1C:
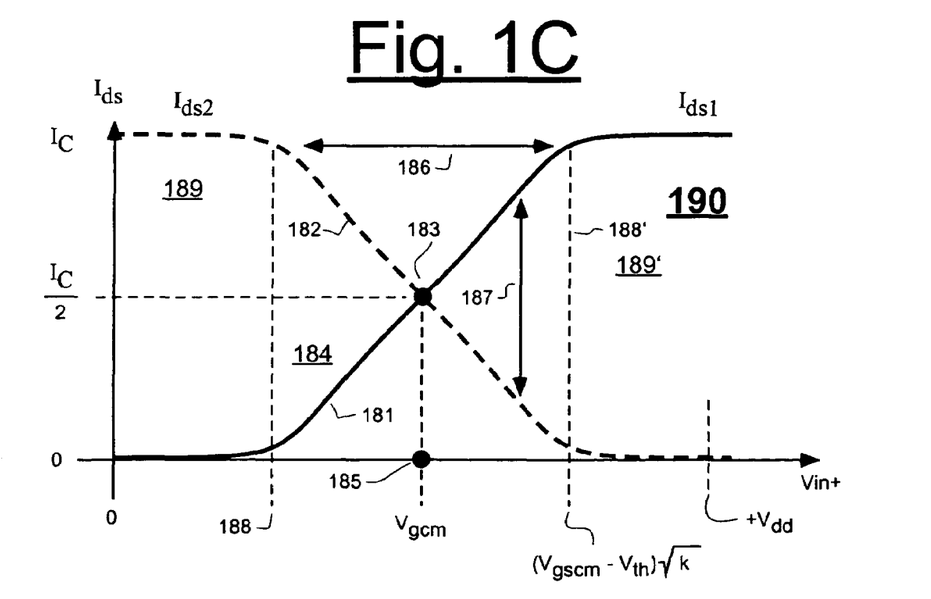
FIG. 1C is a plot of drain current ($I_{ds}$) versus gate input voltage ($V_{in+}$) for explaining the behavior modes of the transistors shown in FIG. 1A.

FIG. 1C explores the concept of $V_{gs}$-choking from another perspective. $V_{gs}$-choking has to do with letting the $V_{dd}$-IR drop of a first amplifier stage (e.g., 110) become too large when in its common mode such that it undesirably reduces the gate voltage, $V_{gcm}$ of the next successive stage (e.g., 120). FIG. 1C shows a plot of drain current ($I_{ds}$) versus gate input voltage ($V_{in+}$). The gate input voltage here is not the same thing as the relative gate-to-source voltage ($V_{gs}$) of FIG. 1B. Instead, it is measured relative to ground. Instead is it measured relative to ground. Solid curve 181 represents the drain current, $I_{ds1}$ of the first transistor, 111 in FIG. 1A while dash curve 182 represents the magnitude of the second drain current, $I_{ds2}$ in the second transistor 112. The knee of curve 181, where it heads into current saturation, tends to be a function of the voltage difference, $V_{gscm}-V_{th}$. (More specifically, for one class of differential amplifiers, it can be shown that the voltage difference, $V_{gscm}-V_{th}$ is proportional to SQRT$\{I_{dscm}/(\beta W/L)\}$.) The cross over point 183 of curves 181 and 182 is where both drain currents are equal to one half of the common sink current, $I_C$, this being the common mode of the differential amplifier 110. The corresponding common mode gate voltage, $V_{gcm}$ is pinpointed at 185. Curves 181 and 182 share a relatively linear region 184 in which they both provide relatively linear amplification, and also a relatively saturated set of regions 189, 189' in which the currents saturate at either zero or the full common sink current $I_C$, depending on which direction the common sink current is being fully steered in. Those skilled in the art will appreciate that the approximate dividing line 188, 188' between the linear and saturated regions is often a function of the gate-to-source voltage, $V_{gs}$ relative to the transistors threshold voltage $V_{th}$. For transistors of dimensions greater than one micron, a multiplying factor of $\sqrt{2}$ is often used to determine the positioning of dividing lines 188, 188'. For deep submicron sized transistors, the multiplying factor often is of a more complex form, symbolized by $\sqrt{k}$. While the position of dividing line 188' is generally fixed by transistor characteristics, the positioning of the $V_{gcm}$ point 185 is variable and depends on the setting of the maximum drain current $I_{dsmax}$ and on the setting of the maximum common sink current $I_C$. The positioning of dividing lines 188 and 188' are roughly symmetrical relative to the $V_{gcm}$ point 185. It may be seen that the maximum linear-region swing 186 of gate voltage relative to the common mode point 185 and the maximum swing of drain current 187 relative to the common mode point are determined by whether the $V_{gcm}$ point 185 is positioned more to the left or more to the right. Pushing $V_{gcm}$ point 185 more to the right also pushes boundary line 188' more so to the right and thereby generally increases the ranges of swings 186 and 187. By contrast, dragging $V_{gcm}$ point 185 more to the left also pushes boundary line 188' more so to the left and thereby disadvantageously reduces the ranges of swings 186 and 187. Such a leftward drag can occur when a preceding amplifier stage has a large voltage drop across its respective drain resistance 114. It is desirable to avoid such $V_{gscm}$-choking while still maintaining wide bandwidth for cascaded amplifiers.

Referring to FIG. 2, a more-complicated amplifier structure 200 is shown. Structure 200 may be modified in accordance with FIG. 3 to thereby provide a cascaded series of programmable, wideband amplifiers in accordance with the invention. The exemplary structure 200 includes a first, summing differential amplifier 210 and a directly coupled, subsequent amplifier stage 220. The first amplifier 210 has respective drain resistances $R_{d1}$ (213) and $R_{d2}$ (214) coupled to a power supply node 215 (+$V_{dd}$). Respective currents $I_{R1}$ and $I_{R2}$ flow through resistors 213 and 214 towards differential output nodes 217 and 216 respectively to thereby define the DC voltage drops, $V_{dd}-I_{R1}R_1$ at node 217 and $V_{dd}-I_{R2}R_2$ at node 216. Three current-sinking sections, A, B and C, are shown coupled to nodes 217 and 216. Other embodiments can have a larger or smaller number of such currents sinking sections. The first current-sinking section, A includes a corresponding and programmably variable, first current sink 207 that conducts common current $I_{cA}$. Twin bucking transistors 211 and 212 are provided in section A with their sources coupled to the first current sink 207. Their drains are respectively coupled to output nodes 217 and 216. A first voltage source 201 couples to the gate 219 (G1) of transistor 211 ($N_{1A}$) and provides a first positive polarity, input voltage $V_{inA+}$ to gate 219. A second voltage source 202 similarly couples to the second gate 218 (G2) of transistor 212 ($N_{2A}$) and provides a corresponding, negative polarity, input voltage, $V_{inA-}$. Voltage sources 201 and 202 are essentially 180° apart in phase. Similar structures are provided in current-sinking sections B and C, however the W/L aspects ratios of transistor pairs $N_{1B}/N_{2B}$ and $N_{1C}/N_{2C}$ may be different. Respective input voltages $V_{inB+}/V_{inB-}$ and $V_{inC+}/V_{inC-}$ can be the same in magnitude and/or in phase as $V_{inA+}/V_{inA-}$ or they can be independent, different signals, this depending on application. The programmable settings of the respective sinking currents, $I_{cA}$ (207), $I_{cB}$ (208) and $I_{cC}$ (209) of the respective A, B and C sections can be programmably set to different magnitudes including zero. Thus if input pairs, $V_{inA+}/V_{inA-}$, $V_{inB+}/V_{inB-}$ and $V_{inC+}/V_{inC-}$ are all the same, and a programmably selected one or two of respective sinking currents, $I_{cA}$ (207), $I_{cB}$ (208) and $I_{cC}$ (209) is set to zero; different gain factors will be obtained from amplifier stage 210.

An adaptive amplification controller 250 couples to the respective current-sinking sections, A, B and C, for controlling their respective current sinks 207, 208 and 209, as well as for controlling the programmably controllable drain resistors 213 and 214 shared by sections, A, B and C. Such programmable control over the first summing differential amplifier 210 may be provided by respective control links 251, 252, 253 and 254 where the last control link 254, controls the common drain resistors 213 and 214. Control link 255 represents similar control couplings to subsequent amplifier stages such as 220.

If the respective input voltages of source pairs 201–202, 203–204 and 205–206 represent different, independent input signals, amplifier stage 210 may be controlled to add these input signals together according to different summation weights. Those skilled in the art will appreciate that the setting of the respective sink currents sunk by elements 207, 208 and 209 can respectively establish the different weighting factors for the input signals. The overall gain ($g_mR$) of the first summing differential amplifier 210 may be further increased by increasing the twin drain resistances $R_{d1}$ and $R_{d2}$. Because the drain resistances 213, 214 can be constantly changed and the respective common sink currents of sections A, B and C can be constantly changed, it is difficult to assure that the problems of $V_{ds}$-choking (FIG. 1B) and $V_{gcm}$-choking (FIG. 1C) are not occurring.

Figure 3:
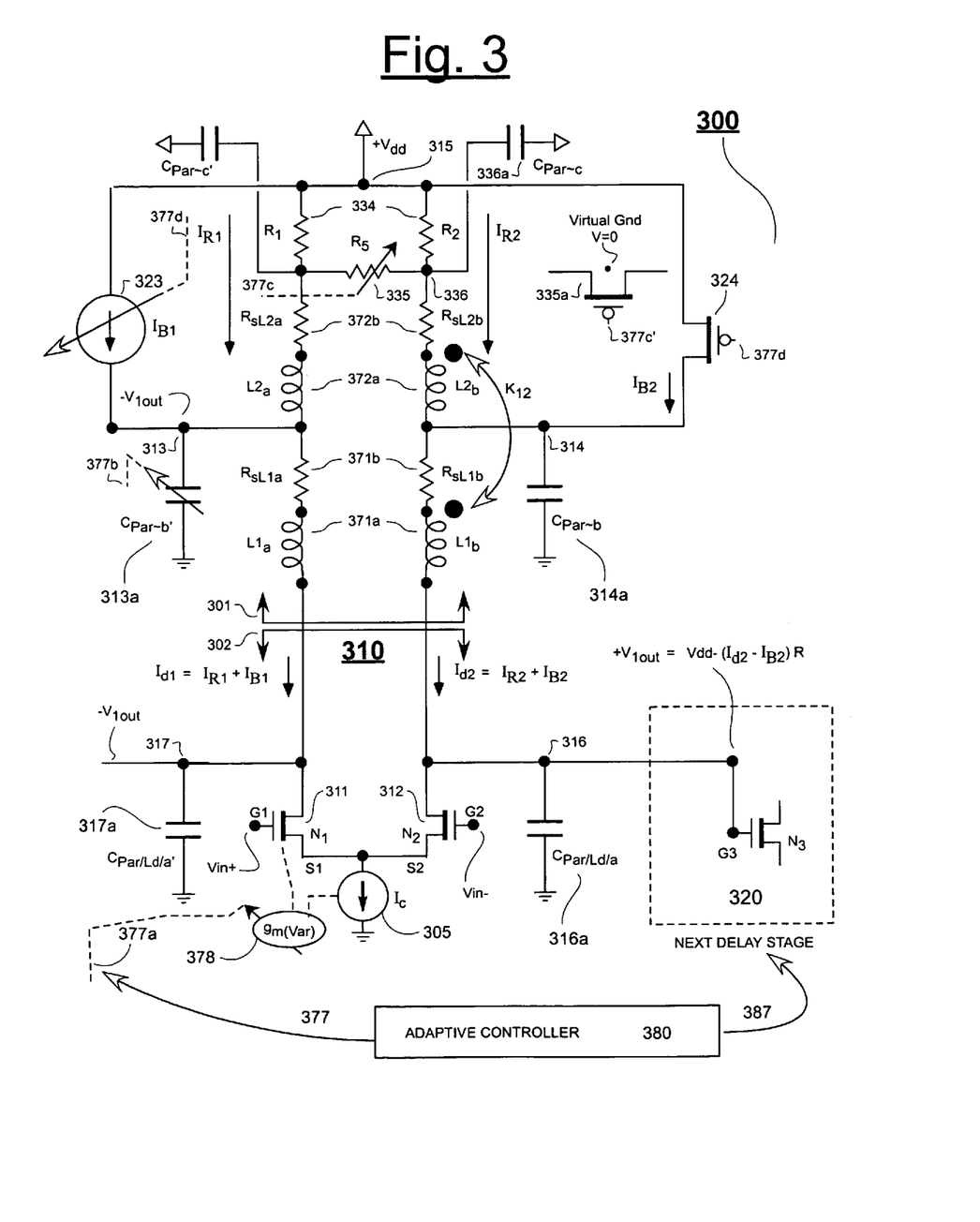
FIG. 3 is a schematic diagram showing a programmably-variable, wideband differential amplifier in accordance with the invention.

Referring to FIG. 3, a differential amplifier stage 310 in accordance with the invention is shown as part of a DC cascaded structure 300 that further includes, similar stage 320. Structure 300 is implemented, in one embodiment, as part of a monolithic integrated circuit. Amplifier stage 310 has a voltage dropping part 301 and a current-sinking part 302. The current-sinking part 302 includes symmetrical transistor means 311, 312 ($N_1$, $N_2$) disposed in bucking relation to feed the sum of their respective drain currents $I_{d1}$, $I_{d2}$ to a first common (and programmably variable) current sink 305. The magnitude of the first common current, $I_c$ is programmably adjustable as are the number of different-width and/or different-length transistors (different W/L ratios) participating to form each of N1 and N2. Although FIG. 3 shows just one current sinking pair 311/312 of transistors and one current sink 305, it is within the contemplation of the present disclosure that current-sinking part 302 can be structured to have plural current-sinking sections like A, B and C of FIG. 2. Transistor means 311/312 may be constituted by programmably activatable transistors of different channel widths (or lengths) for thereby defining the active, W/L aspect ratio (width versus length). The ability to turn different sections (e.g., A, B, C, etc.) on and off and adjust their respective common current sinks provides for a variable transconductance $g_{m(var)}$ as is indicated at 378. Control signal 377a may be used to adjust the overall, base gain of the differential amplifier stage 310 (voltage gain at 0 Hz) by varying the transconductance ($g_m$) as a function of one or more of the number and channel widths of transistors participating to form each of means N1 and N2 and the magnitude of the common currents, $I_c$. The variable transconductance control 377a may thus be used to control the amplifier stage 310 so that the primary base gain (gain at 0 Hz), at its primary output nodes 316 and 317 will be a desired value, $g_m R$, where R is the effective voltage dropping resistance of voltage dropping part 301.

The respective drain impedances of the differentially-opposed transistors, $N_1$ and $N_2$, are symmetrically identical. Each drain impedance in part 301 includes a series of inductors. For example, the drain impedance of $N_1$ includes the illustrated inductances, $L1_a$ and $L2_a$, organized to define a T-coil structure with capacitance 313a and bias injector 323 being in the third leg of the T. The drain impedance of $N_2$ correspondingly includes the illustrated inductances, $L1_b$ and $L2_b$. In one embodiment inductors $L1_a$ and $L2_a$ include vertically stacked spiral coils disposed vertically above one another in different, insulatively spaced apart metal layers (conductive interconnect layers) of an integrated circuit and mutually coupled to each other by a coupling factor $K_{12}$ having a value of approximately one. It is believed, that a mutual coupling factor of $K_{12}$ of approximately unity provides the most physically compact structure for maximizing the effective, combined inductance of $L1_a$ and $L2_a$. Identical stacking is provided for $L1_b$ and $L2_b$. Further drain inductors (not shown) may be included in series with, but not necessarily mutually coupled to the first and second inductors (e.g., $L1_a$ and $L2_a$) of each of the respective drain impedances if desired. Yet further inductors (not shown) may be included as high-frequency chokes in the third leg of each T-coil structure, interposed between capacitance 313a or 314a and the other two, in-series legs of the T-coil structure so as to de-lump capacitances 313a and 314a from other capacitances (316a, 3336a) of the circuit. As will be understood shortly, the plural inductors can be used to de-lump various parasitic and/or intentional capacitances (e.g., 314a) of associated, programmable components (e.g., 324) from one another and from parasitic output capacitances (e.g., 316a). Each of the coils typically has associated with it a parasitic series resistance such as illustrated at 371b and 372b.

In addition to the inductors and their respective, parasitic series resistances (optional), an intentional drain resistance 334 (voltage-dropping resistance) is included in the series path of each of the voltage-dropping currents, $I_{R1}$ and $I_{R2}$. The intentional drain resistance 334 includes a portion ($R_1$, $R_2$) separating the remainder of the respective drain impedance from the power rail node 315 ($+V_{dd}$) so as to thereby de-Q respective parasitic resonant tanks that could be formed by inductances $L2_a$, $L2_b$ and corresponding parasitic capacitances 313a and 314a. In one embodiment, a programmably-variable resistance 335 ($R_5$) is provided between the lower nodes of R1 and R2 (the opposed 334 resistances) for adjusting the effective base gain, $g_m R$, of the primary output nodes 316, 317. In one embodiment each of $R_1$ and $R_2$ is approximately 100 ohms or greater. They can be made programmably variable. The exact resistance of $R_1$ and $R_2$ may vary as a function of fabrication process and/or temperature and/or application. Adjustment of variable resistance $R_5$ may be used to fine tune the effective, primary base gain of the amplifier, $g_m R$ in response to temperature and/or voltage changes. Other techniques for programmably altering the effective drain resistance may be alternatively used. The base gain at output nodes 316, 317 is the voltage gain at 0 Hz frequency, which is simply the effective DC drain resistance, as seen by each of the opposing drain currents $I_{R1}$ and $I_{R2}$ multiplied by the effective transconductance ($g_m$) of the differential amplifier. Because $I_{R1}$ and $I_{R2}$ oppose each other by a differential amount so as to sum to the magnitude of the common current $I_c$ (305) there will be a virtual ground (V=0) somewhere in the mid-point of resistance $R_5$ (335). A variable voltage divider is therefore created for each of the drain legs between the virtual ground and the $+V_{dd}$ voltage level of node 315. The schematic symbol at 335a indicates that variable resistance $R_5$ may be implemented as a single P-channel MOS transistor. Gate control signal 377c' may be used to programmably vary the resistance of transistor 335a. An advantage of such a structure is that it is more compact and it automatically generates its own virtual ground (V=0) without having to adjust for process variations and temperature variations about a true ground node.

As seen in FIG. 3, there can be at least three distributed capacitances associated with each drain impedance, for example, capacitances 316a (at node 316), 314a (at node 314) and 336a (at node 336) for the drain impedance leg of $N_2$. The capacitance value, $C_{par/b}$ of twin capacitances 314a, 313a may be made programmably variable if desired to compensate for voltage and/or temperature and/or process variations. Although not fully shown in FIG. 3, it is understood that the next amplifier stage 320 can also be a differential input device and accordingly the $-V_{1out}$ signal at node 317 couples to the differential counterpart of transistor $N_3$ (in next stage 320). Capacitances 316a and 317a are therefore understood to encompass the parasitic or other capacitances of the corresponding input terminals of next stage 320 and of routing interconnect connected to those corresponding input terminals.

Because prediction of the frequency response of the illustrated differential amplifier 310 can be relatively complex, it is advisable to use computer simulation for determining the values of the various illustrated parameters for realizing a desired frequency-domain transfer function. It has been found that the ratio of the inductances of the first inductors 371a to the second inductors 372a should be made a function of the nominal expected capacitances of parasitic output capacitances 316a, 317a, as well as the mid range capacitance of the optionally variable capacitances 314a, 313a and of the parasitic capacitance $C_{par/c}$ (336a) associated with the variable drain resistance. Thus, $$L_1/L_2 = f(C_{para}, C_{parb}, C_{parc}) \qquad \text{Eq. 2.}$$

The optionally variable capacitance, $C_{par-b}$ (314a and 313a) may be programmably varied by use of control signal 377b to compensate for changes in temperature, for fabrication process variations and for changes in supply voltage ($+V_{dd}$) so that the frequency response from one integrated circuit to the next can be made substantially the same if so desired. Variable resistance $R_5$ (335) is also programmably variable to provide a desired $g_m R$ value. Thus control signals such as 377a, 377b, 377c and soon-described 377d may be used to fine tune the base frequency behavior (0 Hz) and higher frequency behavior of the amplifier stage 310. Control signals 377a–377d may be made the same or may be individualized for each of the cascaded amplifier stages, 310, 320, etc. populating amplifier series 300.

In accordance with the invention, programmably-variable current injectors 323 and 324 are respectively coupled to nodes 313 and 314 as shown for the purpose of injecting transistor bias currents $I_{B1}$ and $I_{B2}$ into respective nodes 313 and 314. The other ends of injectors 323 and 324 do not need to be tied to the +Vdd rail 315. They can be connected to a different (e.g., higher voltage) power rail. Since injectors 323 and 324 are respectively injecting additional and essentially identical bias currents, $I_{B1}$ and $I_{B2}$ into nodes 313 and 314, the drain current entering transistor N1 will be $I_{d1}=I_{R1}+I_{B1}$. The current entering the drain of transistor N2 will similarly be $I_{d2}=I_{R2}+I_{B2}$. The magnitude of bias currents $I_{B1}$ and $I_{B2}$ may be adjusted independently of the common mode magnitude of voltage-dropping currents $I_{R1}$ and $I_{R2}$. The common-mode drain current levels of transistors N1 and N2 may therefore be moved to a desired level even when the variable drain resistors 334–335 are made relatively large. Drain resistors 334–335 may be programmably adjusted to be relatively large in order to increase the base gain ($g_mR$) of the amplifier stage 310.

Referring back briefly to FIG. 1B, it may be seen that even if common mode point 164 is initially shifted towards the far left by virtue of the load line 155 being pivoted counter clockwise around point 169 (this representing an increase of drain load resistance), the actual operating point of transistors N1 and N2 may nonetheless be kept in the desirable saturation region 154 by increasing the bias current $I_{B1}$ and $I_{B2}$ supplied to the drains of the respective transistors. This will have the effect of moving the $I_c/2$ line 157a and the $I_c$ line 157b higher up to thereby expand operating range 156. Referring also briefly to FIG. 1C, the insertion of the bias currents, $I_{B1}$ and $I_{B2}$ works to increase the effective magnitude 187 of drain current range by moving the magnitude of crossover point 183 higher up along the $I_{ds}$ axis. In moving the crossover point 183 higher up along solid curve 181, the effect is that the $V_{gcm}$ point 185 is moved further to the right, thereby reducing the $V_{gcm}$-choking problem.

FIG. 3 shows one particular embodiment in which current injector 324 is implemented as a single PMOS transistor coupled between power rail 315 and node 314 and it is understood that symmetrical injector 323 will be similarly structured in that embodiment. The voltage at gate 377d is used to adjust the saturation current through PMOS transistor 324. Of course, other forms of current sources may be provided including cascoded transistors and current mirroring controls for defining the magnitude of the injected bias current $I_{B2}$. Transistor 324, or whatever other means is used for providing programmable-variable bias current $I_{B2}$ can inherently add capacitance to parasitic capacitance 314a. However, because the bias injection node 314 is separated from corresponding output node 316 and from programmable resistance node 336 by a T-coil structure defined by inductors $L1_b$ and $L2_b$, the parasitic capacitance shown at 314a is not lumped together with the parasitic capacitances shown at 316a and 336a. Each of these parasitic capacitances 314a, 316a and 336a has a tendency to shunt high frequency current towards AC ground. However, as frequency increases, series inductances such as $L1_b$ and $L2_b$, have a tendency to boost current flow out of the amplifier output node (316) and to thereby counteract the current sinking effects of separated capacitances like 314a, 316a and 336a (or 313a, 317a and $C_{Par-c'}$). The result is a differential amplifier that can have relatively high bandwidth and can simultaneously have the ability to selectively provide relatively high gains (by increasing the values of the drain resistors $R_1$, $R_2$, $R_5$; and/or by increasing the aspect ratio (W/L) and common sink current 305 of transistor means N1 and N2).

The use of injected bias currents such as $I_{B1}$ and $I_{B2}$ consumes power. An adaptive controller 380 is provided and operatively linked by way of control links 377d to turn the bias current sources 323 and 324 off when they are not needed and to set their magnitudes to appropriate levels as needed in view of corresponding settings made to the drain resistances and common sink current 305 and/or aspect ratios of transistors N1/N2 at any given time during operation of differential amplifier stage 310. A pre-programmed memory means (not shown) may be used within adaptive controller 380 for establishing at substantially the same time, the control parameters 377a–377d for each desired setting of each respective amplifier stage such as 310, 320, etc.

The DC voltage developed at output node 316 of stage 310 and input terminal G3 of stage 320 will be approximately $V_{dd}-I_{R2} \cdot R_2$ (assuming $R_5$ is very large and $R_{sL1,2}$ are negligible). Because $I_{R2}$ may be expressed as $I_{d2}-I_{B2}$, the common mode voltage at the next stage gate, G3 may be expressed approximately as $$+V_{1out\_cm}=V_{dd}-(I_{d2}-I_{B2}) \cdot R_2 = V_{dd}-(I_C/2-I_{B2}) \cdot R_2,$$

It may be seen therefore that programmably-commanded increases of either $I_C$ or of $R_2$ may be countered by programmably-commanded increases of $I_{B2}$ in order to keep the common mode value of $+V_{1out\_cm}$ (node 316) at or near a desired magnitude. Therefore, the adaptive controller 380 may be operated to programmably select different values of $I_C$ and/or of $R_2$ for each amplifier stage while keeping the common mode DC voltage, $V_{dd}-I_{R2} \cdot R_2$ relatively constant at interstage coupling nodes such as 316. Programmable flexibility may be had without losing bandwidth. The T-coil structure of inductances such as $L1_b$ and $L2_b$ keeps corresponding parasitic capacitances such as $C_{par-b}$ (314a) from becoming lumped with $C_{par-a}$ (316a) and/or $C_{par-c}$ (336a).

Methods for providing variable capacitances such as optionally for capacitances 314a and 313a of FIG. 3 are well known and need not be detailed here. Discrete switches may be used in combination metal-insulator-metal (MIM) capacitors and/or voltage sensitive or insensitive MOS capacitors may be used. It is worthy to note that the capacitance-setting switches should be appropriately sized so as to reduce their series resistance. Increasing transistor size also tends to increase and the parasitic capacitance. Thus, reduction of switch resistance and switch capacitance trade off with each other.

Methods for providing variable transconductance ($g_{mVar}$) are disclosed for example in the above-cited U.S. Ser. No. 10/724,449 (Digitally Controlled Transconductance Cell, which disclosure is incorporated herein by reference). Briefly, and as already mentioned, the number of transistors (e.g., different sized transistors with different W/L aspect ratios) participating in each of the symmetrical branches of the differential amplifier (310) may be programmably changed and/or the magnitude of the common constant current (305) may be programmably changed. This has the effect of changing the amplifier's transconductance, $g_{mVar}$ (378).

If desired, the frequency response of amplifier 310 may be changed by varying the inductance values of L1 and/or L2. Various methods may be used as desired, for tuning one or more of the inductances (L1 and L2) in each amplifier stage 310, 320 of FIG. 3. These methods may include a programmable switching in and out of additional inductors and/or changing the mutual inductance between L1 and L2. Such methods are disclosed for example in the above-cited U.S. Ser. No. 10/698,317 originally entitled "Programmable Passive Inductor" and incorporated herein by reference.

In conclusion it is seen that a space and energy efficient solution has been provided for countering the $V_{ds}$-choking and $V_{gcm}$-choking problems of DC cascaded differential amplifiers without substantial loss of bandwidth. Energy may be conserved by turning off the bias injectors 323, 324 when they are not needed. It may be shown that inductive drain boosting (where inductances such as 371a and 372a are placed in series within the conduction paths of the voltage-dropping currents, $I_{R1}$ and $I_{R2}$) is a more energy efficient way than alternatives for compensating for losses in shunt capacitances (e.g., 316a) as frequency increases. Thus a relatively broadband response can be attained with good energy efficiency.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A differential amplifier comprising:
   (a) first and second matched transistor means having respective first and second drains through which respective first and second drain currents flow, where the first and second drains coupling to respective first and second voltage output nodes of the differential amplifier, and where magnitudes of the first and second drain currents define a constant sum;
   (b) first and second, variable and matched drain impedances respectively coupled to the first and second drains, each of the variable drain impedances having at least two inductors (L1, L2), an output shunt capacitance and a resistance, wherein at least said resistance is adjustable so that an output voltage versus input voltage transfer function of the differential amplifier can be tuned at least at 0 Hz (base frequency) by adjusting the resistance; and
   (c) first and second, variable current injectors respectively coupled to inject additional bias current into respective injection nodes interposed between the at least two inductors (L1, L2) of each of the first and second variable drain impedances so that the injected additional bias currents increase drain currents of the respective first and second transistor means to magnitudes greater than magnitudes of voltage-dropping currents passing through the respective resistances of the first and second variable drain impedances, where at least one of the first and second inductors in each drain impedance separates the respective bias current injector from the corresponding voltage output node of the drain impedance.

2. The differential amplifier of claim 1 wherein:
   (d) at least a second of the first and second inductors in each drain impedance separates the respective bias current injector from the adjustable resistance of the drain impedance so that a corresponding parasitic capacitance of the resistance is inductively de-lumped from the respective current injection node and from the corresponding voltage output node.

3. The differential amplifier of claim 1 wherein:
   (b.1) in each drain impedance, the respective at least two inductors (L1, L2) are mutually coupled to one another.

4. The differential amplifier of claim 1 further comprising:
   (b.1) in each drain impedance, a respective and programmably adjustable capacitance coupled to the respective current injection node.

5. A common mode biasing method for use in a differential amplifier having first and second transistor means with respective first and second drain nodes through which respective first and second drain currents pass, the first and second drain nodes being operatively coupled to respective first and second voltage output nodes of the differential amplifier, said biasing method comprising:
   (a) injecting programmably adjustable, twin biasing currents through respective first inductors respectively into the first and second drain nodes so that capacitances of bias injection sources providing the biasing currents are inductively separated from the first and second drain nodes.

6. The common mode biasing method of claim 5 and further comprising:
   (b) using second inductors to separate the bias injection sources from voltage-dropping resistances of the differential amplifier.

7. The common mode biasing method of claim 6 and further comprising:
   (c) programmably adjusting at substantially a same time, the voltage-dropping resistances of the differential amplifier and magnitudes of the twin biasing currents.

8. The common mode biasing method of claim 6 and further comprising:
   (c) programmably adjusting at substantially a same time, effective width versus length aspect ratios of the first and second transistor means and magnitudes of the twin biasing currents.

9. The common mode biasing method of claim 6 and further comprising:
   (c) programmably adjusting at substantially a same time, a magnitude of current sunk by one or more common current sources of the first and second transistor means and magnitudes of the twin biasing currents.

10. The common mode biasing method of claim 9 wherein:
    (c.1) said one or more common current sources includes a plurality of programmably controlled current sources that can be programmably turned on or switched into a substantially no-current sinking mode.

11. The common mode biasing method of claim 6 wherein:
said first and second inductors and said first and second transistor means are integrally provided within a monolithic integrated circuit.

12. The common mode biasing method of claim 6 wherein:
said first and second inductors are mutually coupled to one another.

13. A cascaded series of differential amplifiers comprising:
(a) two or more differential amplifiers where each of the differential amplifiers includes opposed transistor means and corresponding drain resistances, and
    (a.1) gain-establishing means for variably-setting the gain of the corresponding amplifier, and
    (a.2) twin current injection sources respectively provided each to inject a drain-current increasing bias current into a corresponding current injection node to combine with a corresponding voltage-dropping current flowing through the drain resistance of the corresponding transistor means to thereby define drain currents of the corresponding transistor means;
    (a.3) respective inductors interposed between the current injection nodes used by the twin current injection sources and corresponding amplifier output nodes so that capacitances of the twin current injection sources are not additively lumped with capacitances of the corresponding amplifier output nodes.

14. A differential amplifier comprising:
(a) first and second symmetrical transistors having respective first and second drains through which sum-constant currents ($I_{d1}+I_{d2}=I_c$) respectively flow; and
(b) first and second, symmetrical drain impedances ($Z_{d1}$, $Z_{d2}$) respectively coupled to the first and second drains,
    (b.1) where each of the drain impedances has a resistance and a current injection node, where the current injection node of each drain impedance is operatively coupled to a corresponding and variable current injection source so that the current injection source can inject an additive bias current of variable magnitude in addition to voltage-dropping current conducted by the corresponding resistance thereby causing the drain current of the corresponding transistor to exceed the voltage-dropping current, and
    (b.2) where a first inductance is interposed between the current injection node of each of the drain impedances and a corresponding amplifier output node so that capacitance of the current injection source is not additively lumped into associated capacitance of the corresponding amplifier output node.

15. The differential amplifier of claim 14 wherein:
(b.3) where a second inductance is interposed between the current injection node of each of the drain impedances and the resistance so that capacitance of the current injection source is not additively lumped into associated capacitance of the corresponding resistance.

16. The differential amplifier of claim 15 wherein:
(b.4) said first and second inductances of each drain impedance are mutually coupled to one another.

17. The differential amplifier of claim 16 wherein:
(b.4a) a mutual coupling factor of about one is defined by the mutually coupling in each drain impedance of the corresponding first and second inductances to one another.

18. The differential amplifier of claim 16 wherein:
(b.4a) the first and second inductances of the at least one of the drain impedances are respectively provided as comprising spiral coils disposed respectively and overlappingly in insulatively spaced apart, first and second conductive layers of a monolithic integrated circuit.

19. The differential amplifier of claim 15 wherein:
(d) said resistance of each drain impedance includes a variable resistance.

20. The differential amplifier of claim 14 and further comprising:
(c) variable transconductance means which is adjustable for thereby providing the differential amplifier with a variable transconductance factor ($g_{m(var)}$).

21. The differential amplifier of claim 14 wherein:
(b.1) each drain impedance includes an adjustable capacitance and/or an adjustable inductance.

22. The differential amplifier of claim 1 wherein each of the first and second transistor means comprises a plurality of transistors.

23. The differential amplifier of claim 22 wherein the plural transistors of each of the first and second transistor means include transistors of different channel widths.

24. The differential amplifier of claim 23 wherein each of the first and second transistor means includes one or more switches for selectively deactivating one or more of the plural transistors of the corresponding transistor means.

25. A differential amplifier comprising:
(a) a first transistor having a first source, first drain and first gate;
(b) a second transistor, matching the first transistor and having a second source, second drain and second gate;
(c) a common current source coupled to the first and second sources;
(d) a first impedance coupled to the first drain, wherein the first impedance includes a series combination of a first resistance and a first inductance, the first inductance being interposed between the first resistance and the first drain;
(e) a second impedance, matching the first impedance and coupled to the second drain;
wherein the second impedance includes a series combination of a second resistance and a second inductance, the second inductance being interposed between the second resistance and the second drain;
(f) a first variable current source coupled to inject a first additive bias current into a first circuit point between the first resistance and first inductance such that the first additive bias current passes through the first inductance and into the first drain; and
(g) a second variable current source coupled to inject a second additive bias current into a second circuit point between the second resistance and second inductance such that the second additive bias current passes through the second inductance and into the second drain.

26. The differential amplifier of claim 25 wherein:
(d.2) the first impedance includes a third inductance interposed between the first resistance and first inductance, and where said first circuit point is disposed between the first inductance and said third inductance; and
(e.2) the second impedance includes a fourth inductance interposed between the second resistance and second inductance, and where said second circuit point is disposed between the second inductance and said fourth inductance.

27. The differential amplifier of claim 26 wherein:
(d.3) said first and third inductances are inductively coupled to one another; and
(e.3) said second and fourth inductances are inductively coupled to one another.

28. The differential amplifier of claim 27 wherein:
said respective inductive couplings of the first and third inductances and of the second and fourth inductances each has a mutual coupling factor, K having a value of approximately one.

29. The differential amplifier of claim 26 wherein:
(de.3) each of said first and second resistances includes a variable resistance.

30. The differential amplifier of claim 29 wherein:
(c.1) said common current source is a variable current source.

31. The differential amplifier of claim 26 and further comprising:
(h) a variable resistance coupled to define a bridge between the first and second resistances.

32. A common mode biasing method for use in a differential amplifier having first and second transistors with respective first and second drains through which respective first and second drain currents pass, the method comprising:
(a) injecting an adjustable first biasing current through a first inductor into the first drain; and
(b) injecting an adjustable second biasing current through a second inductor into the second drain.

33. The biasing method of claim 32 and further comprising:
(c) interposing a third inductor between the first inductor and a load resistance of the first transistor; and
(d) interposing a fourth inductor between the second inductor and a load resistance of the second transistor.

34. The biasing method of claim 33 and further comprising:
(e) adjusting at substantially a same time, magnitudes of the first biasing current and the load resistance of the first transistor; and
(f) adjusting at substantially the same time, magnitudes of the second biasing current and the load resistance of the second transistor.

35. The biasing method of claim 29 and further comprising:
(c) adjusting at substantially a same time, magnitudes of the first and second biasing currents and of a common current sunk from the first and second transistors.

36. A series of differential amplifiers where one or more of the differential amplifiers respectively includes:
(a) a first transistor having a first source, first drain and first gate;
(b) a second transistor, matching the first transistor and having a second source, second drain and second gate;
(c) a common current source coupled to the first and second sources;
(d) a first impedance coupled to the first drain, wherein the first impedance includes a series combination of a first resistance and a first inductance, the first inductance being interposed between the first resistance and the first drain;
(e) a second impedance, matching the first impedance and coupled to the second drain, wherein the second impedance includes a series combination of a second resistance and a second inductance, the second inductance being interposed between the second resistance and the second drain;
(f) a first variable current source coupled to inject a first additive bias current into a first circuit point between the first resistance and first inductance so that the first additive bias current passes through the first inductance and into the first drain; and
(g) a second variable current source coupled to inject a second additive bias current into a second circuit point between the second resistance and second inductance so that the second additive bias current passes through the second inductance and into the second drain.

37. A differential amplifier comprising:
(a) a first transistor means having a first drain node and one or more first source nodes;
(b) a second transistor means having a second drain node and one or more second source nodes, the second transistor means being matched to the first transistor means;
(c) a first drain impedance coupled to the first drain node, the first drain impedance having a variable first resistor and a first inductor coupled to the first resistor so that a first current flowing through the first resistor also flows through the first inductor and into the first drain node;
(d) a second drain impedance coupled to the second drain node, the second drain impedance being matched to the first drain impedance and having a variable second resistor and a second inductor coupled to the second resistor so that a second current flowing through the second resistor also flows through the second inductor and into the second drain node;
(e) a first variable current source coupled to provide a first additional and variable bias current to the first drain node so that total current drained through the first drain node can be different than the first current flowing through the first resistor; and
(f) a second variable current source coupled to provide a second additional and variable bias current to the second drain node so that total current drained through the second drain node can be different than the second current flowing through the second resistor.

38. The differential amplifier of claim 37 wherein each of the first and second transistor means comprises a plurality of transistors.

39. The differential amplifier of claim 38 wherein the plural transistors of each of the first and second transistor means include transistors of different channel widths.

* * * * *